(12) United States Patent
Yang et al.

(10) Patent No.: US 11,761,080 B2
(45) Date of Patent: Sep. 19, 2023

(54) METHOD FOR PROCESSING A SUBSTRATE BY OSCILLATING A BOUNDARY LAYER OF THE FLOW OF ONE OR MORE PROCESS GASES OVER A SURFACE OF A SUBSTRATE AND SYSTEMS FOR PROCESSING A SUBSTRATE USING THE METHOD

(71) Applicant: Applied Materials, Inc., Santa Clara, CA (US)

(72) Inventors: Tsung-Han Yang, San Jose, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 17/142,052

(22) Filed: Jan. 5, 2021

(65) Prior Publication Data

US 2022/0213595 A1    Jul. 7, 2022

(51) Int. Cl.
| | |
|---|---|
| *C30B 25/16* | (2006.01) |
| *C23C 16/455* | (2006.01) |
| *C23C 14/48* | (2006.01) |
| *C23C 16/52* | (2006.01) |
| *C30B 25/14* | (2006.01) |
| *C23C 14/54* | (2006.01) |

(52) U.S. Cl.
CPC ........ *C23C 16/45502* (2013.01); *C23C 14/48* (2013.01); *C23C 14/54* (2013.01); *C23C 16/45548* (2013.01); *C23C 16/52* (2013.01); *C30B 25/14* (2013.01); *C30B 25/165* (2013.01)

(58) Field of Classification Search
CPC ......... C30B 25/00; C30B 25/02; C30B 25/14; C30B 25/16; C30B 25/165; C23C 16/44; C23C 16/448; C23C 16/455; C23C 16/45502; C23C 16/4506; C23C 16/45548; C23C 16/52; C23C 14/48; C23C 14/54
USPC ......... 117/84, 88–89, 93, 102, 105, 200–202
See application file for complete search history.

(56) References Cited

U.S. PATENT DOCUMENTS

| | | | |
|---|---|---|---|
| 4,916,089 A * | 4/1990 | Van Suchtelen | ...... B01L 3/0289 117/957 |
| 5,593,741 A * | 1/1997 | Ikeda | ................ H01L 21/02164 427/575 |
| 7,137,354 B2 | 11/2006 | Collins et al. | |
| 7,713,757 B2 | 5/2010 | Foad et al. | |
| 8,129,261 B2 | 3/2012 | Porshnev et al. | |
| 8,664,126 B2 | 3/2014 | Yao | |

(Continued)

*Primary Examiner* — Kenneth A Bratland, Jr.
(74) *Attorney, Agent, or Firm* — Patterson + Sheridan, LLP

(57) ABSTRACT

Aspects of the present disclosure generally relate to oscillating a boundary layer of a flow of process gas in methods and systems for processing substrates. In one aspect, one or more of a pressure, a gas flow rate, and/or a height of a substrate are oscillated during processing. In one implementation, a method of processing a substrate includes conducting a processing operation on the substrate in an interior volume of a processing chamber. The conducting the processing operation on the substrate includes moving a flow of one or more process gases over a surface of the substrate. The method also includes oscillating a boundary layer of the flow of one or more process gases while the flow of one or more process gases moves over the surface of the substrate.

20 Claims, 5 Drawing Sheets

(56) References Cited

U.S. PATENT DOCUMENTS

| 2002/0073917 | A1* | 6/2002 | Hashimoto | C30B 29/406 117/84 |
| 2011/0100489 | A1* | 5/2011 | Orito | H01L 21/68771 137/560 |
| 2012/0302048 | A1 | 11/2012 | Santhanam et al. | |
| 2019/0228997 | A1 | 7/2019 | Hu et al. | |

* cited by examiner

US 11,761,080 B2

1

METHOD FOR PROCESSING A SUBSTRATE BY OSCILLATING A BOUNDARY LAYER OF THE FLOW OF ONE OR MORE PROCESS GASES OVER A SURFACE OF A SUBSTRATE AND SYSTEMS FOR PROCESSING A SUBSTRATE USING THE METHOD

BACKGROUND

Field

Aspects of the present disclosure generally relate to oscillating a boundary layer of a flow of process gas in methods and systems for processing substrates. In one aspect, one or more of a pressure, a gas flow rate, and/or a height of a substrate are oscillated during processing to induce boundary layer oscillation.

Description of the Related Art

During substrate processing operations, process gases can flow over substrates. A boundary layer for the flow of gas can exist adjacent to the surface of the substrate. The slower flow of gases in the boundary layer can limit chemical reactions of reactants and can limit flow of reactants to the substrate, which can hinder processing operations and can hinder conformality of layers formed upon the substrates.

Therefore, there is a need for improved apparatus, systems, and methods that reduce effects of boundary layers in flows of process gases to facilitate one or more of increased throughput, reduced downtime, and increased conformality.

SUMMARY

Aspects of the present disclosure generally relate to oscillating a boundary layer of a flow of process gas in methods and systems for processing substrates. In one aspect, one or more of a pressure, a gas flow rate, and/or a height of a substrate are oscillated during processing.

In one implementation, a method of processing a substrate includes conducting a processing operation on the substrate in an interior volume of a processing chamber. The conducting the processing operation on the substrate includes moving a flow of one or more process gases over a surface of the substrate. The method also includes oscillating a boundary layer of the flow of one or more process gases while the flow of one or more process gases moves over the surface of the substrate. The oscillating the boundary layer includes one or more of: oscillating a pressure of the interior volume, oscillating an amount of the one or more process gases introduced into the interior volume, oscillating a height of the substrate in the interior volume, oscillating a distance between a ceiling of the interior volume and the surface of the substrate, or oscillating a distance between a gas injection assembly and the surface of the substrate.

In one implementation, a non-transitory computer-readable medium includes instructions that, when executed, cause a system to conduct a processing operation on a substrate in an interior volume of a processing chamber. The conducting the processing operation on the substrate includes moving a flow of one or more process gases over a surface of the substrate. The instructions, when executed, also cause the system to oscillate a boundary layer of the flow of one or more process gases while the flow of one or more process gases moves over the surface of the substrate. The oscillating the boundary layer includes one or more of: oscillating a pressure of the interior volume, oscillating an amount of the one or more process gases introduced into the interior volume, oscillating a height of the substrate in the interior volume, oscillating a distance between a ceiling of the interior volume and the surface of the substrate, or oscillating a distance between a gas injection assembly and the surface of the substrate.

In one implementation, a system for processing substrates includes a processing chamber having an interior volume, a substrate support disposed in the interior volume, and a gas inlet fluidly coupled to an inlet path and a gas source to introduce one or more process gases into the interior volume. The system also includes a gas outlet fluidly coupled to an outlet path and a vacuum pump to exhaust the one or more process gases from the interior volume. The system also includes a rotatable valve disposed upstream of the vacuum pump along the outlet path. The rotatable valve includes a valve housing, and a flapper that is freely rotatable relative to the valve housing. The system also includes a pump motor coupled to the rotatable valve to rotate the flapper. The system also includes a pressure control valve disposed between the rotatable valve and the vacuum pump along the outlet path.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure generally relate to oscillating a boundary layer of a flow of process gas in methods and systems for processing substrates. In one aspect, one or more of a pressure, a gas flow rate, and/or a height of a substrate are oscillated during processing.

Figure 1A:
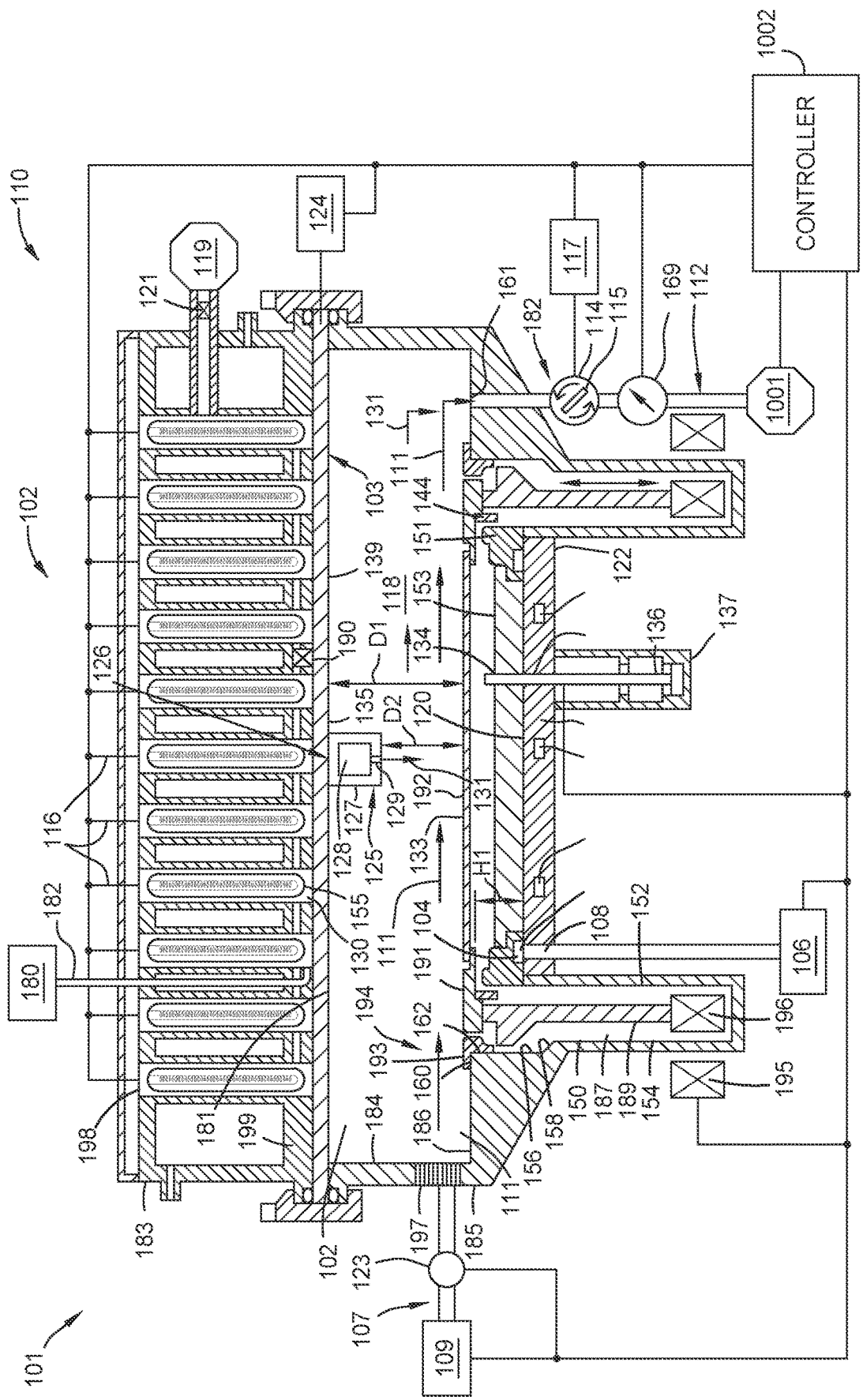
FIG. 1A is a schematic partial sectional view of a system for processing substrates, according to one implementation.

FIG. 1A is a schematic partial sectional view of a system 101 for processing substrates, according to one implementation. The system 101 includes a processing chamber 110. The processing chamber 110 includes a chamber body 185 having a first portion 184 forming a sidewall of the chamber body 185, a second portion 186 coupled to the first portion and partially defining a floor or base of the chamber body 185, a window 135 disposed on the first portion 184 of the chamber body 185, and a lamp assembly 183 disposed on the window 135. A chamber base 188 is coupled to the chamber body 185 opposite the window 135. The lamp assembly 183 includes a housing 199 with a plurality of openings 130 formed therein. A plurality of lamps 155 is disposed in the housing 199, and a single lamp 155 is disposed within a corresponding opening 130. The lamps 155 are disposed in respective electrical sockets 198 which are concentrically aligned with the corresponding openings 130. The lamps 155 are coupled to a controller 1002 via a plurality of electrical conduits 116 and the electrical sockets 198.

During operation, a substrate 192 is loaded into the processing chamber 110 through a transfer port, such as a slit valve port. The substrate 192 is positioned on a plurality of lift pins 136. The lift pins 136 actuate to position the substrate 192 onto a substrate support 191. The lamps 155 heat the substrate 192 to a desired processing temperature while the substrate support 191 is rotated to rotate the substrate about a central axis during a processing operation. During the processing operation, one or more process gases are flowed into the processing chamber 110 to deposit a new material layer or modify a previously deposited layer on the substrate 192. After completion of the processing operation, the substrate 192 may undergo one or more additional processing operations within the process chamber 110 or the substrate 192 may be removed from the processing chamber 110. After processing of the substrate 192 in the processing chamber 110, the plurality of lift pins 136 are actuated to raise the substrate 192 from the substrate support 191. The substrate 192 is then removed from the processing chamber 110 through the transfer port.

The processing operation conducted in the processing chamber 110 includes one or more of an oxidation operation, a plasma immersion ion implantation operation, an epitaxial deposition operation, a chemical vapor deposition (CVD) operation, an atomic layer deposition (ALD) operation, an etching operation, or a thermal annealing operation. The processing chamber 110 described is an oxidation chamber. The present disclosure contemplates that aspects of the system 101 and the processing chamber 110 may be used in conjunction with a plasma immersion ion implantation chamber, an epitaxial deposition chamber, a chemical vapor deposition (CVD) chamber, a physical vapor deposition (PVD) chamber, an atomic layer deposition (ALD) chamber, an etching chamber, or a thermal annealing chamber.

The lamps 155 emit electromagnetic (EM) radiation that passes through the window 135 and towards the substrate 192 disposed in the processing chamber 110 to heat the substrate 192 to a processing temperature. The window 135 is typically made of a material chemically resistant to the processing environment and able to allow one or more wavelengths of EM radiation emitted by the plurality of lamps 155 to pass through the window 135 without being substantially attenuated. For example, quartz may be used as the window 135 material. Other suitable materials include, but are not limited to, sapphire, ceramic, and glass.

The window 135 may be coated with an anti-reflective coating, or suitable filters, on one or both sides of the window 135. For example, optional ultra-violet (UV) filters can be used to avoid generation of ions and radicals in the chamber or damage to UV-sensitive structures on the substrate 192 if the lamps 155 have significant UV output. As another example, optional notch filters can be used to block narrow band radiation emitted from the lamps 155. In one embodiment, which can be combined with other embodiments, a filter 139 is disposed on an inside (e.g. process-facing) surface of the window 135. The filter 139 blocks radiation having wavelengths within a specific range from passing therethrough while allowing radiation having wavelengths outside of the specific range to pass. The filter 139 may be a plurality of alternating layers, such as oxide layers. In one embodiment, which can be combined with other embodiments, the filter 139 includes alternating silicon dioxide layers and titanium dioxide layers. For example, the filter 139 may include a total of 30 to 50 alternating layers, such as 35 to 45 alternating layers, with silicon dioxide layers located at opposite sides (e.g. an outside surface and an inside surface) of the filter 139. The filter 139 may be coated on an outside surface (e.g. facing the lamp assembly 183) of the window 135, an inside surface (e.g. facing the substrate support 191) of the window 135, or may be embedded within the window 135.

A reflector plate 153 is disposed on the chamber base 188 at a location within the processing chamber 110. The reflector plate 153 includes a plurality of openings 134 extending therethrough. The plurality of lift pins 136 are at least partially extendable within the processing chamber 110, and each of the lift pins 136 extends through one of the plurality of openings 134. The chamber base 188 a plurality of openings 138. Each of the plurality of openings 138 is aligned with a corresponding opening 134 of the plurality of openings 134 of the reflector plate 153. Each lift pin 136 is disposed within a receptacle 137 that is coupled to the chamber base 188 of the processing chamber 110 and concentric with the openings 134, 138. The lift pins 136 are magnetically actuated to raise and lower through the openings 134, 138.

During operation, the lamps 155 generate EM radiation that is emitted therefrom towards the substrate 192. A portion of the EM radiation typically passes through the substrate 192. The intensity of the EM radiation that passes through the substrate 192 is a function of the temperature of the substrate 192 and of the wavelength of the EM radiation. The system 101 can include radiation detectors (such as pyrometers and/or spectrometers) that measure blackbody radiation from the substrate and/or EM radiation emitted by the lamps 155 that has passed through the substrate 192 to measure a temperature of the substrate 192. An incident radiation detector 180 (such as a spectrometer or pyrometer) is optionally coupled to the housing 199 of the lamp assembly 183. The incident radiation detector 180 is used to sample the EM radiation emitted by the plurality of lamps 155 at a position before the emitted EM radiation interacts with the substrate 192. The EM radiation detected by the incident radiation detector 180 can be compared to the EM radiation detected by the radiation detectors to determine the amount of EM radiation that passes through the substrate 192 for substrate temperature measurements.

In one embodiment, which can be combined with other embodiments, the lamps 155 are arranged in the housing 199 in a honeycomb array. The lamps 155 may be divided into groups to define multiple heating zones on the substrate 192. In one embodiment, which can be combined with other embodiments, the heating zones are concentric rings. The radiation detectors may correspond to one of the zones. A temperature or temperature signal determined by operation of the radiation detectors, which may correspond to a defined heating zone, is provided to the controller 1002. The controller 1002 can individually adjust the power supplied the lamps 155 corresponding to the one or more heating zones to adjust the energy emitted thereto. The temperature profile across the substrate 192 can be adjusted as desired. Additionally, a plurality of detectors 190 can be disposed within the housing 199 (one detector 190 is shown in FIG. 1). The detector 190 is located between adjacent openings 130 and proximate to the window 135. The detector 190 is line-of-sight exposed to an upper surface 133 of the substrate 192 through the window 135. The detector 190 is used to determine a temperature of the substrate 192 at the upper surface 133 thereof. The detector 190 is an optical sensor, such as a pyrometer, and receives EM radiation emitted from the upper surface 133 of the substrate 192. A measured parameter of the EM radiation received by detector 190 from the substrate 192, such as wavelength or intensity, is used to determine a temperature of the substrate 192. In one embodiment, which can be combined with other embodiments, the detector 190 is a reflectometer that measures reflectivity of the substrate 192 for temperature measurements.

The processing chamber 110 includes an interior volume 102. A ceiling 103 of the interior volume 102 is defined at least partially by the window 135, such as the filter 139 of the window 135. The substrate support 191 is disposed in the interior volume 102. The processing chamber 110 includes a gas inlet 197 formed in the first portion 184 (e.g., the sidewall) of the chamber body 185. The present disclosure contemplates that the gas inlet 197 can be formed through the ceiling 103, such as through the window 135. The gas inlet 197 is fluidly coupled to a first inlet path 107 and a first gas source 109 to introduce the one or more process gases 111 into the interior volume 102. During the processing operation, the first gas source 109 is used to introduce the one or more process gases 111 into the interior volume 102 through one or more valves (a supply valve 123 is shown in FIG. 1) disposed along the first inlet path 107.

A motor 124 can be coupled to the window 135 and/or the filter 139 to move at least a portion of the window 135 and/or the filter 139 upwardly and downwardly. Movement of at least the portion of the window 135 and/or filter 139 upwardly and downwardly moves the ceiling 103 upwardly and downwardly to optionally oscillate a distance D1 between the ceiling 103 of the interior volume 102 and the upper surface 133 of the substrate 192. Oscillating the ceiling 103 upwardly and downwardly oscillates a volume of the processing region 118. The present disclosure contemplates that a different upper component, such as a showerhead or a gas distribution plate, may be used in place of the window 135 and the filter 139.

In one embodiment, which can be combined with other embodiments, a diaphragm 181 may be positioned below the window 135 and above the substrate 192 such that the diaphragm 181 defines the ceiling 103 of the interior volume 102. The diaphragm 181 has a low mass and/or a compressible material such that the diaphragm 181 is movable, such as by the motor 124 and/or by the processing gases 111, 131. The diaphragm 181 is oscillated upwardly and downwardly to oscillate the distance D1 between the ceiling 103 of the interior volume 102 and the upper surface 133 of the substrate 192.

The processing chamber 110 includes a gas outlet 161 (such as an exhaust port) fluidly coupled to an outlet path 112 and a vacuum pump 1001 to exhaust the one or more process gases 111 from the interior volume 102. The gas outlet 161 is formed vertically in the second portion 186 of the chamber body 185. A rotatable valve 182 is disposed upstream of the vacuum pump 1001 along the outlet path 112. The rotatable valve 182 includes a valve housing 114 and a flapper 115 that is freely rotatable relative to the valve housing 114. The gas outlet 161 is formed on an opposite side of the substrate support 191 and the substrate 192 relative to the gas inlet 197. The gas outlet 161 is formed radially outside of the substrate support 191 and the substrate 192. A pump motor 117 is coupled to the rotatable valve 182 to rotate the flapper 115. A pressure control valve (PCV) 169 is disposed between the rotatable valve 182 and the vacuum pump 1001 along the outlet path 112. The PCV 169 is utilized to control and maintain the pressure within the interior volume 102 of the processing chamber 110. The PCV 169 is selectively opened, closed, or partially opened (e.g., throttled) to change the rate at which the processing gases 111 are exhausted from the processing chamber 110.

A second vacuum pump 119 can optionally be connected to the lamp assembly 183. The pressure within the lamp assembly 183 is controlled by a valve 121 disposed in a foreline of the second vacuum pump 119. During the processing operation, the pump motor 117 rotates the flapper 115 in a rotational direction while the one or more process gases 111 are introduced into the interior volume 102, thereby oscillating a pressure of the interior volume 102. In one embodiment, which can be combined with other embodiments, the flapper 115 rotates in a single continuous rotational direction.

The present disclosure contemplates that the gas outlet 161 can be formed horizontally in the first portion 184 on an opposite side of the substrate support 191 and the substrate 192 relative to the gas inlet 197. As the one or more processing gases 111 flow from the gas inlet 197 and toward the gas outlet 161, the one or more processing gases 111 move over the upper surface 133 of the substrate 192.

In one embodiment, which can be combined with other embodiments, the system 101 includes a gas injection assembly 125. The gas injection assembly 125 includes a linear showerhead 126 extending above the substrate support 191 and the substrate 192. The linear showerhead 126 includes a longitudinal duct 127 having a central opening 128 extending longitudinally and a plurality of openings 129 formed in a bottom of the longitudinal duct 127. The longitudinal duct 127 is formed of quartz. The longitudinal duct 127 can have a cross section that is rectangular in shape (as shown in FIG. 1A) or circular in shape such that the longitudinal duct 127 is a cylindrical tube. During the processing operation, the gas injection assembly 125 introduces one or more processing gases 131 into the interior volume 102. The one or more processing gases 131 may flow from the first gas source 109 or a different gas source. The one or more processing gases 131 may have the same gas composition as the one or more processing gases 111. The gas injection assembly 125 is movable upwardly and downwardly using a motor 132 (shown in FIG. 2A) to oscillate a distance D2 between the gas injection assembly 125 and the upper surface 133 of the substrate 192. In one embodiment, which can be combined with other embodiments, the distance D2 is between the upper surface 133 and the bottom of the longitudinal duct 127.

In one embodiment, which can be combined with other embodiments, the one or more process gases 111 and/or the one or more process gases 131 include one or more of Ar, $O_2$, He, and/or $H_2O$.

An annular channel 187 is formed in the chamber body 185, and a rotor 196 is disposed in the channel 187. The channel 187 is located adjacent to the second portion 186 of the chamber body 185. The processing chamber 110 further includes a rotatable support member 189 disposed in the channel 187. The rotatable support member 189 is supported on and/or coupled to the rotor 196. The substrate support 191 is supported on the rotatable support member 189, and a shield 194 is disposed on the second portion 186 of the chamber body 185. The rotatable support member 189 is fabricated from a material having minimal change in material properties, such as tensile strength or thermal expansion, across a range of temperatures, or resistance to degradation due to exposure to heat. An exemplary material for the rotatable support member 189 is quartz. In one embodiment, which can be combined with other embodiments, the rotatable support member 189 is cylindrical, such as a cylindrical sleeve. In one embodiment, which can be combined with other embodiments, the substrate support 191 is an annular edge ring on which an outer periphery, such as an outer circumferential edge, of the substrate 192 is supported during the processing operation conducted on the substrate 192. The rotatable support member 189 and the substrate support 191 are at least a part of a substrate support assembly.

The channel 187 has an outer wall 150 and an inner wall 152. A lower first portion 154 of the outer wall 150 has a first radius and an upper second portion 156 of the outer wall 150 has a second radius greater than the first radius. A third portion 158 of the outer wall 150 connecting the first portion 154 to the second portion 156 has a cross-sectional profile that extends linearly from the first portion 154 to the second portion 156, forming a slanted surface that faces toward the substrate support 191. The shield 194 has a first portion 160 that rests on the second portion 186 of the chamber body 185 and a second portion 162 that extends into the channel 187 along the second portion 156 of the outer wall 150. The first portion 160 of the shield 194 contacts the second portion 186 of the chamber body 185, and the second portion 162 of the shield 194 contacts the second portion 156 of the outer wall 150. The shield 194 extends partially over the channel 187. In one embodiment, which can be combined with other embodiments, the shield 194 is a rotor cover. The shield 194 is an annular ring. The shield 194 may have one or more gaps extending in a radial direction from a center thereof. The shield 194 can be fabricated from a ceramic material, such as alumina. The shield 194 further includes a first surface 193 facing the window 135. The first surface 193 is substantially flat, and is oriented away from a portion of a processing region 118 of the processing chamber 110 located above the substrate 192, so radiant energy is not reflected therefrom towards the substrate 192. In one embodiment, which can be combined with other embodiments, the first surface 193 of the shield 194 is substantially parallel to the window 135. In one embodiment, which can be combined with other embodiments, the first surface 193 is annular. The processing region 118 of the interior volume 102 is between the substrate 192 and the ceiling 103.

The substrate 192 is disposed on the substrate support 191 during the processing operation. A stator 195 is located external to the chamber body 185 in a position axially aligned with the rotor 196. The rotor 196 is disposed in the interior volume 102 and inwardly of the stator 195. The substrate support 191 is supported on the rotor 196 through the rotatable support member 189, and the substrate support 191 is movable upwardly and downwardly using the rotor 196 and the stator 195.

In one embodiment, which can be combined with other embodiments, the stator 195 is a magnetic stator, and the rotor 196 is a magnetic rotor. The stator 195 has a plurality of electric coils therein which circumscribe the channel 187. During operation, the stator 195 applies a sequence of currents to the coils at defined intervals. The currents within the coils create a series of magnetic fields which are coupled to a magnetic portion of the rotor 196, such as a magnet disposed therein, through the outer wall 150. The currents are applied to the coils in a sequence so that the magnetic fields formed therein attract the magnetic portion of the rotor 196 and bias the rotor 196 to rotate about an axis which in turn rotates the rotatable support member 189 magnetically coupled thereto, the substrate support 191, and the substrate 192. The currents applied to the coils of the stator 195 can also be used to move the rotor 196 upwardly and downwardly within the interior volume. During the processing operation, the currents are pulsed to oscillate the rotor 196, and hence oscillate the substrate support 191 and the substrate 192, upwardly and downwardly within the interior volume 102. The currents are pulsed to oscillate a height H1 of the substrate support 191 in the interior volume 102. In one embodiment, which can be combined with other embodiments, the height H1 is between the substrate support 191 and the chamber base 188. In one embodiment, which can be combined with other embodiments, the height H1 is between the substrate support 191 and the second portion 186. Oscillating the height H1 oscillates a height of the substrate 192 disposed on the substrate support 191.

During the processing operation, a temperature of the substrate support 191 may raise more than a temperature of the substrate 192, thereby raising a temperature of an edge of the substrate 192 relative to a center of the substrate 192. A cooling member 151 can be disposed on the chamber base 188 in proximity to the substrate support 191 to cool the substrate support 191 using convection. The cooling member 151 convects heat from the substrate support 191 and the substrate 192 when disposed thereon. The chamber base 188 includes a first surface 120 and a second surface 122 opposite the first surface 120. As shown in FIG. 1, the cooling member 151 is in direct contact with the first surface 120 of the chamber base 188.

A thickness of the substrate support 191 may be selected to provide a desired thermal mass. The substrate support 191 can act as a heat sink, which mitigates overheating at the edge of the substrate 192. In one embodiment, which can be combined with other embodiments, a feature 144, such as a fin, is formed on the substrate support 191 to provide thermal mass. The feature 144 may be continuous, for example cylindrical, or discontinuous, for example a plurality of discrete fins.

The feature 144 may be formed on a surface of the substrate support 191 that is facing the channel 187 when the substrate support 191 is installed in the chamber 100, and may extend into the channel 187, as shown in FIG. 1. In one embodiment, which can be combined with other embodiments, the feature 144 is formed on a surface of the substrate support 191 that is facing the window 135. In one embodiment, which can be combined with other embodiments, a combination of one or more features 144 facing the channel 187 and one or more features 144 facing the window 135 may be used. As depicted in FIG. 1, the feature 144 may be substantially perpendicular to a major surface of the substrate support 191. In one embodiment, which can be combined with other embodiments, the feature 144 may extend obliquely from the major surface of the substrate support 191.

The chamber base 188 includes a plurality of channels 157 formed therein for a coolant, such as water, to flow therethrough. Cooling the chamber base 188 also draws heat from, and thus cools, the cooling member 151. The cooling member 151 may be fabricated from a material having high heat conductivity, such as a metal, for example, aluminum. The cooling member 151, in turn, functions as a heat sink to the substrate support 191 due to close proximity of the cooling member 151 to the substrate support 191.

The cooling member 151 includes a recess 104 formed in the surface thereof that is in contact with the first surface 120 of the chamber base 188. The recess 104 can be used to circulate a cooling fluid for further cooling of the cooling member 151. In one embodiment, which can be combined with other embodiments, the cooling member 151 is an annular ring, and the recess 104 is an annular recess. A cooling gas may be flowed from a gas source 106 through the cooling member 151 via the recess 104 to provide additional cooling of the cooling member 151. The cooling gas increases heat transfer between the cooling member 151 and the substrate support 191, thus further cooling the substrate support 191. The cooling gas may be helium, nitrogen, or other suitable gas. The cooling gas flows through a passage 108 formed in the chamber base 188 and through a channel 105 defined between the recess 104 and the first surface 120 of the chamber base 188.

The controller 1002 is configured to control various operations of the system 101 described above. The controller 1002 is also configured to control various operations described herein. The controller 1002 is coupled to at least one or more of the lamps 155, the vacuum pump 1001, the PCV 169, the rotatable valve 182, the pump motor 117, the stator 195, the first gas source 109, the supply valve 123, the motor 124, and/or the motor 132 (shown in FIG. 2A). The controller 1002 is configured to cause one or more of the operations of the method 300 described below to be conducted. The controller 1002 includes a non-transitory computer-readable medium. The controller 1002 includes a processor, support circuitry, and instructions that—when executed by the processor—cause the operations to be conducted.

The instructions of the controller 1002 can include one or more machine learning/artificial intelligence algorithms that can be executed in addition to the operations described herein. As an example, a machine learning/artificial intelligence algorithm executed by the controller 1002 can optimize and alter a pulse frequency (e.g., an oscillation frequency) of the supply of process gases based on a residence time frequency of reactants within the interior volume 102. The pulse frequency is the inverse of the residence time frequency. The machine learning/artificial intelligence algorithm can account for a measured residence time frequency, a known volume amount of the interior volume 102, and composition(s) of the process gases 111, 131.

Figure 1B:
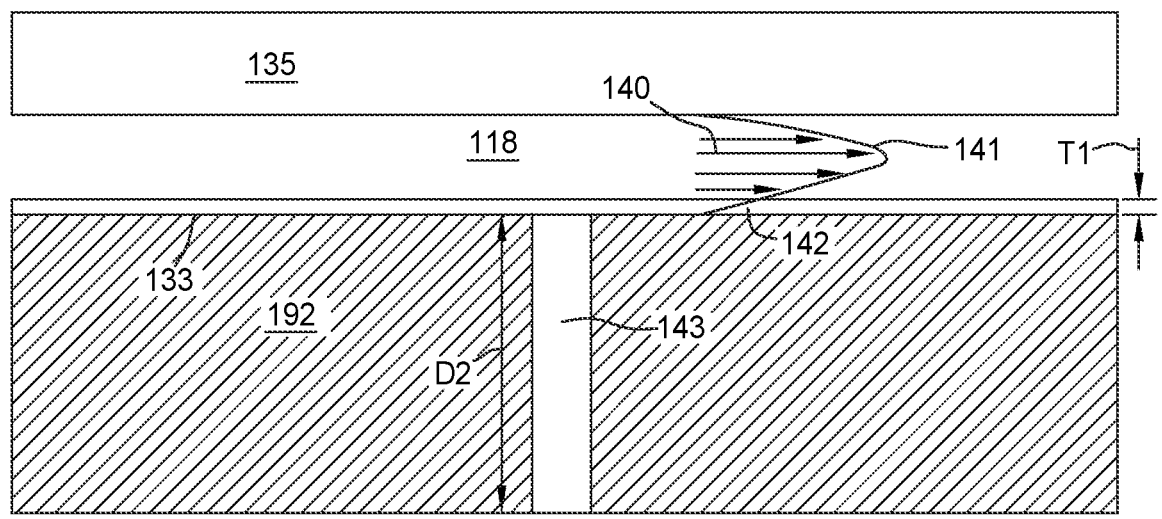
FIG. 1B is an enlarged partial schematic view of the system shown in FIG. 1A during the processing operation, according to one implementation.

FIG. 1B is an enlarged partial schematic view of the system 101 shown in FIG. 1A during the processing operation, according to one implementation. FIG. 1B illustrates a flow 140 of the one or more process gases 111 and/or the one or more process gases 131 between the substrate 192 and the window 135. The flow 140 has a flow profile with a peak velocity 141. In one embodiment, which can be combined with other embodiments, the peak velocity 141 is about 50 meters per second. The flow 140 has a boundary layer 142. The boundary layer 142 has a thickness T1. The boundary layer 142 having the thickness T1 is a portion of the flow 140 that is on the side of the peak velocity 141 adjacent the upper surface 133 of the substrate 192 where a velocity is within a range of 5% to 10% of the peak velocity 141.

The substrate 192 includes a 3D feature 143 formed in the upper surface 133. The 3D feature 143 can include one or memory holes, one or more vias, and/or one or more trenches. In the implementation shown, the 3D feature 143 is a memory hole. The 3D feature 143 extends into the substrate by a depth D2 of about 10 micrometers. The flow 140 of the one or more process gases 111 and/or the one or more process gases 131 moves over the upper surface 133. During the moving of the flow 140, reactants of the one or more process gases 111 and/or the one or more process gases 131 flow vertically into and out of the 3D feature 143. In one embodiment, which can be combined with other embodiments, the reactants flow vertically into and out of the 3D feature 143 in a manner that achieves effusion, where a mean flow path of the reactants is larger than a hole diameter of the 3D feature 143 such that the reactants of the process gases 111, 131 quickly flow into and out of the 3D feature 143. Effusion is facilitated, for example, using oscillation of the boundary layer 142 as described herein.

Figure 1C:
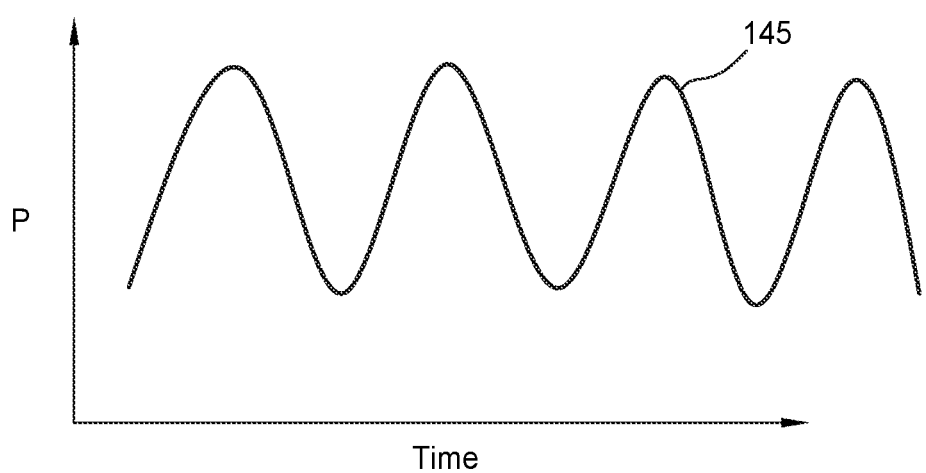
FIG. 1C is a schematic graphical illustration of an oscillation frequency, according to one implementation.

FIG. 1C is a schematic graphical illustration of an oscillation frequency 145, according to one implementation. As shown in FIG. 1C, the oscillation frequency has a sinusoidal profile, which can be used for the various parameters described herein that are oscillated. The "P" of the vertical axis represents units of an operational parameter described herein, such as the pressure in the interior volume 102, an amount of the one or more processing gases 111 and/or the one or more processing gases 131 in the interior volume 102, the height H1, the distance D1, and/or the distance D2. In one embodiment, which can be combined with other embodiments, oscillating such parameters oscillates the thickness T1 of the boundary layer 142 and/or a distance of the boundary layer 142 relative to the substrate 192. In one embodiment, which can be combined with other embodiments, oscillating such parameters oscillates the thickness T1 of the boundary layer 142. The "T" of the horizontal axis" represents time.

Figure 2A:
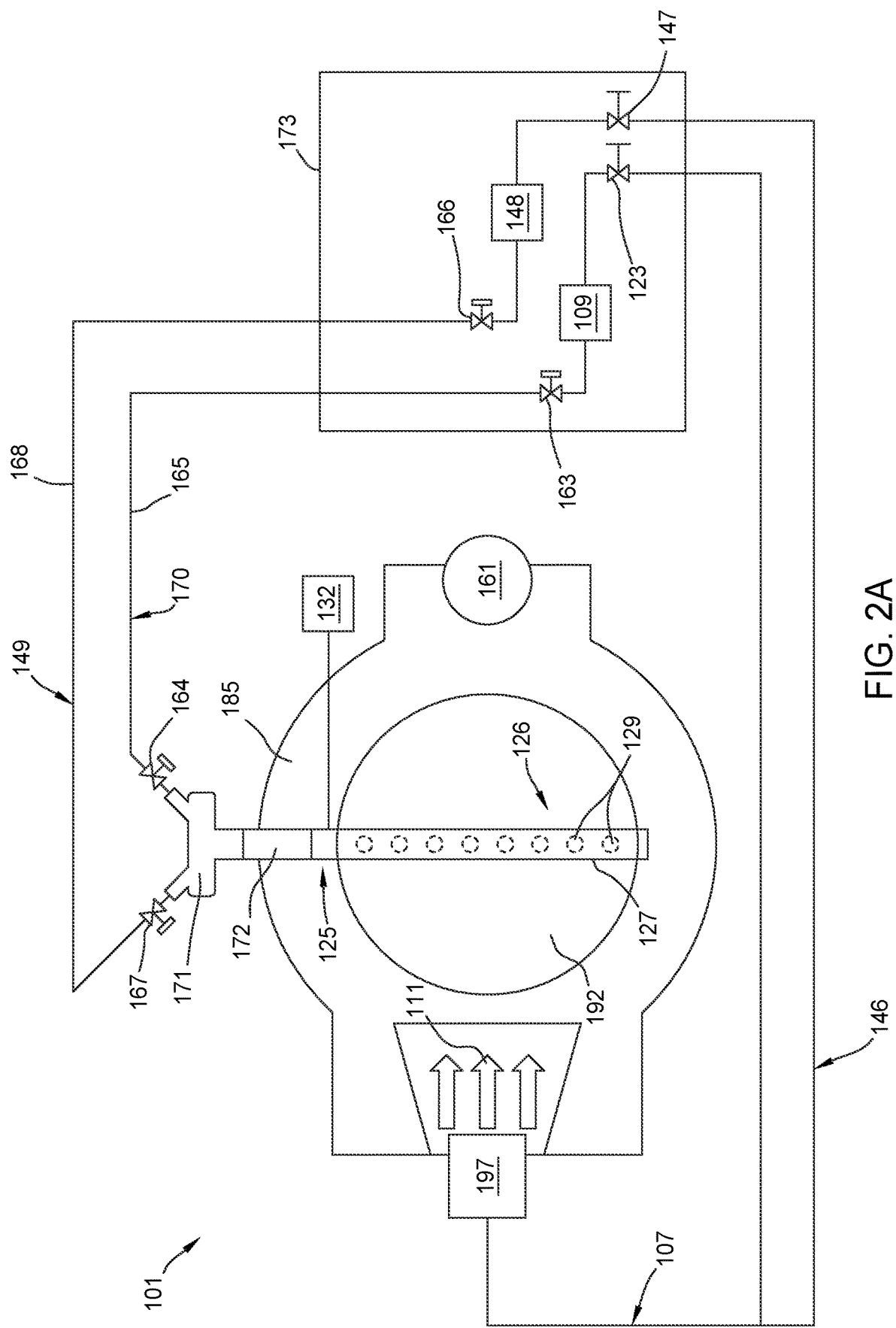
FIG. 2A is a schematic partial top view of the system shown in FIG. 1A, according to one implementation.

FIG. 2A is a schematic partial top view of the system 101 shown in FIG. 1A, according to one implementation. A second inlet path 146 having a supply valve 147 joins with the first inlet path 107 leading to the gas inlet 197. The supply valve 147 disposed along the second inlet path 146 is fluid coupled to a second gas source 148. The linear showerhead 126 of the gas injection assembly 125 is fluidly coupled to a first supply path 170 and a second supply path 149. To oscillate an amount of the one or more processing gases 131 in the interior volume 102 supplied using the gas injection assembly 125 (thus oscillating the pressure within the interior volume 102), a first supply valve 163 coupled to the first gas source 109 along the first supply path 170 is opened while a second supply valve 164 is closed. The second supply valve 164 is downstream from the first supply valve 163 along the first supply path 170. Opening the first supply valve 163 while the second supply valve 164 is closed charges a charge volume of a line 165 between the first supply valve 163 and the second supply valve 164. After the opening of the first supply valve 163, the first supply valve 163 is closed and the second supply valve 164 is opened while the first supply valve 163 is closed to introduce the one or more process gases from the first gas source 109 into the interior volume 102. Opening the second supply valve 164 runs and releases the process gases from the charge volume of the line 165 into the interior volume 102. The opening the first supply valve 163 while the second supply valve 164 is closed, the closing of the first supply valve 163, and the opening the second supply valve 164 while the first supply valve 163 is closed can be repeated to pulse the supply of the process gases from the first gas source 109.

The second supply path 149 includes a first supply valve 166 and a second supply valve 167 disposed along the second supply path 149. The first supply valve 166 and the second supply valve 167 can be operated in a manner similar to the first supply valve 163 and the second supply valve 164 of the first supply path 170 to pulse the supply of the one or more process gases from the second gas source 148. A charge volume of a line 168 between the first supply valve 166 and the second supply valve 167 is used to pulse the supply of the one or more process gases from the second gas source 148. The process gases from the first supply path 170 and the process gases from the second supply path 149 join at a gas block 171. The gas block 171 is fluidly coupled to the linear showerhead 126 through a gas conduit 172. The gas block 171 and/or the gas conduit 172 extend at least partially through a sidewall (such as the first portion 184) of the chamber body 185.

In the implementation shown in FIG. 2A, the first gas source 109, the second gas source 148, the supply valve 123, the supply valve 147, the first supply valve 163, and the first supply valve 166 are disposed within a gas box 173. The present disclosure contemplates that respective orifices of the valves 163, 164, 166, and 167 may be varied (e.g., altered) without completely closing or completely opening the orifices to pulse the supply of the one or more process gases 131 and oscillate an amount of the one or more process gases 131 in the interior volume 102. The respective orifices may be oscillated. The present disclosure contemplates that the respective valves 163, 164, 166, and 167 may be completely closed and completely opened to pulse the supply of the one or more process gases 131 and oscillate an amount of the one or more process gases 131 in the interior volume 102. In one embodiment, which can be combined with other embodiments, the supply of the one or more process gases 111 is provided at a substantially constant gas flow while the boundary layer is oscillated as described herein. In one embodiment which can be combined with other embodiments, each of the first supply valve 163 and the first supply valve 166 is a fast valve having a cycle rate (a rate at which the valve can open and close) that is 0.02 seconds-per-gas or less. In one embodiment, which can be combined with other embodiments, the cycle rate is 0.01 seconds-per-gas. In one example, which can be combined with other examples, each fast valve pulses two gases at the cycle rate of 0.01 seconds-per-gas or less such that a single pulse cycle of the two gases lasts 0.02 seconds or less. In one embodiment, which can be combined with other embodiments, each of the first supply valve 163 and the first supply valve 166 is a fast valve having a switching rate (a rate at which the valve switches between open and close) that is 0.01 seconds or less.

Each of the second gas source 148, the supply valve 147, the first supply valve 163, the second supply valve 164, the first supply valve 166, and/or the second supply valve 167 can be coupled to the controller 1002 (shown in FIG. 1A) to control the operations thereof.

Figure 2B:
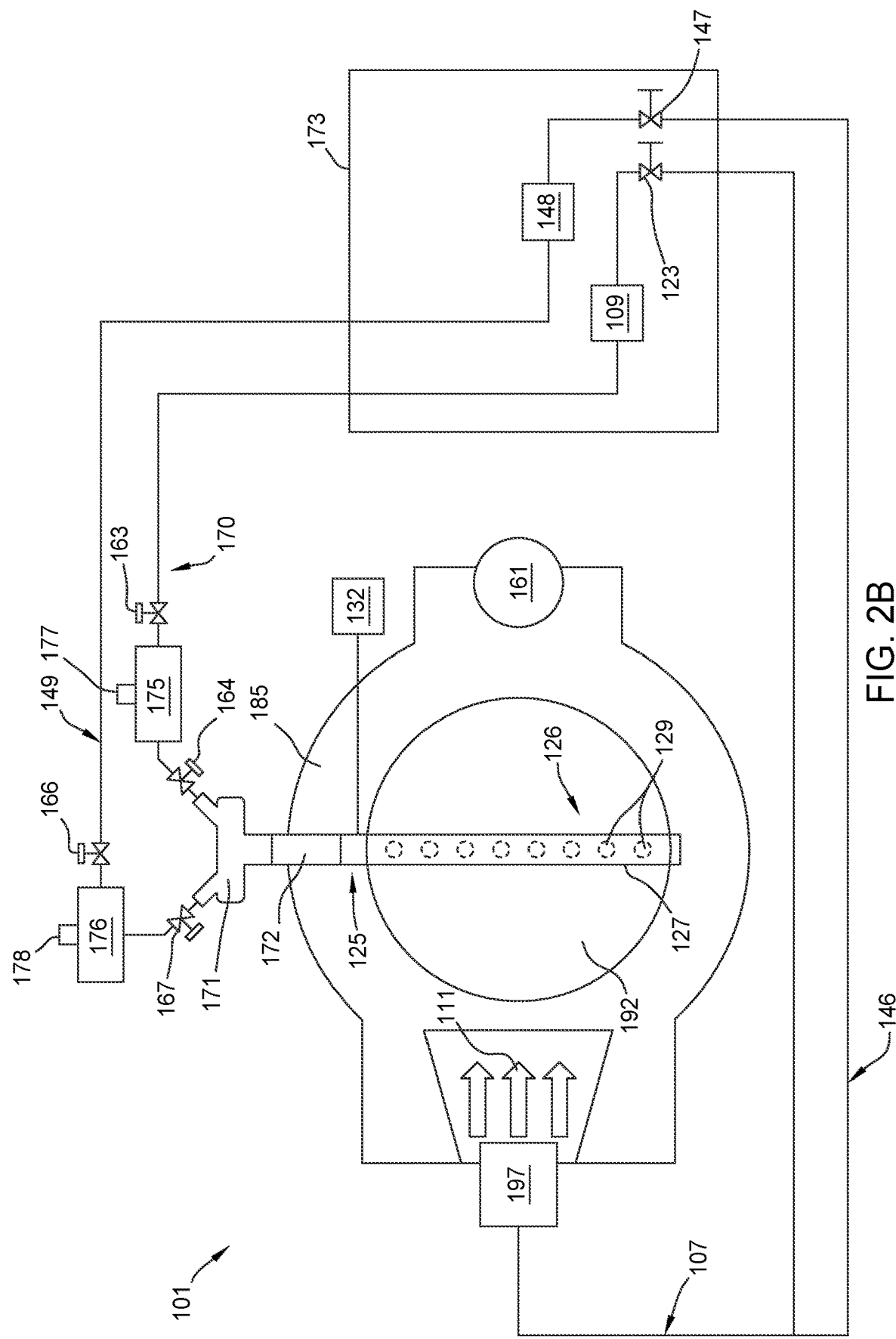
FIG. 2B is a schematic partial top view of the system shown in FIG. 1A, according to one implementation.

FIG. 2B is a schematic partial top view of the system 101 shown in FIG. 1A, according to one implementation. The implementation shown in FIG. 2B is similar to the implementation shown in FIG. 2A. In the implementation shown in FIG. 2B, the first supply valve 163 and the first supply valve 166 are disposed outside of the gas box 173 and further downstream along the respective first supply path 170 and second supply path 149. In the implementation shown in FIG. 2B, a first charge volume 175 is positioned between the first supply valve 163 and the second supply valve 164 along the first supply path 170, and a second charge volume 176 is positioned between the first supply valve 166 and the second supply valve 167 along the second supply path 149. Each of the first charge volume 175 and the second charge volume 176 is part of a respective container having a pressure gauge 177, 178 coupled thereto. Each of the first charge volume 175 and the second charge volume 176 has an internal width (such as an internal diameter) that is larger than an internal width (such as internal diameter) of the respective first or second supply path 170, 149. The first charge volume 175 and the second charge volume 176 can be charged and ran (e.g., released), as described for the charge volumes of the lines 165, 168 of the implementation shown in FIG. 2A.

Figure 3:
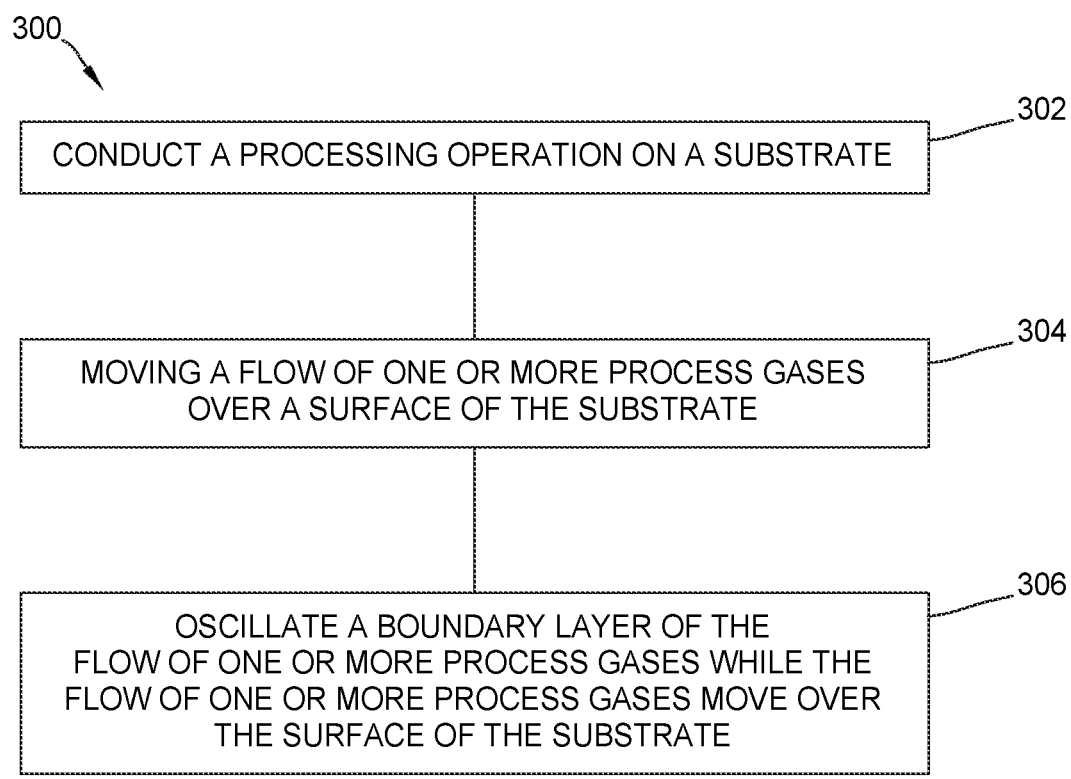
FIG. 3 is a schematic view of a method of processing a substrate, according to one implementation.

FIG. 3 is a schematic view of a method 300 of processing a substrate, according to one implementation. Operation 302 of the method 300 includes conducting a processing operation on the substrate in an interior volume of a processing chamber. The processing operation includes one or more of an oxidation operation, a plasma immersion ion implantation operation, an epitaxial deposition operation where, a chemical vapor deposition (CVD) operation, a physical vapor deposition (PVD) operation, an atomic layer deposition (ALD) operation, an etching operation, and/or a thermal annealing operation. The oxidation operation oxidizes at least a portion of the substrate. The plasma immersion ion implantation operation includes immersing the substrate in plasma and implanting ions on or into the substrate. The epitaxial deposition operation includes growing an epitaxial layer on the substrate.

Operation 304 of the method 300 includes moving a flow of one or more process gases over a surface of the substrate. The moving the flow of one or more process gases includes flowing reactants of the one or more process gases into a 3D feature of the substrate. The flow of one or more process gases includes a peak velocity and a boundary layer at a distance relative to the substrate. The boundary layer includes a thickness. In one example, the process gases flow generally parallel to an upper surface of a substrate in a "cross flow" regime. Operation 306 of the method 300 includes oscillating the boundary layer of the flow of one or more process gases while the flow of one or more process gases moves over the surface of the substrate. The oscillating the boundary layer at operation 306 includes oscillating one or more of the thickness of the boundary layer and/or the distance of the boundary layer relative to the substrate. The oscillating the boundary layer includes one or more of: oscillating a pressure of the interior volume, oscillating an amount of the one or more process gases introduced into the interior volume, and/or oscillating a height of the substrate in the interior volume. One or more of the pressure, the amount, the height, and/or the distance is oscillated at an oscillation frequency that is within a range of 100 Hz to 1,000 Hz. One or more of the pressure, the amount, the height, and/or the distance is oscillated along a sinusoidal profile.

In one embodiment, which can be combined with other embodiments, the oscillating the pressure of the interior volume includes exhausting the one or more process gases from the interior volume through a rotatable valve positioned along an exhaust path of the processing chamber. The rotatable valve includes a flapper that is freely rotatable relative to a valve housing. In one example, which can be combined with other examples, the rotatable valve is a butterfly valve. The oscillating the pressure of the interior volume also includes rotating the flapper using a pump motor coupled to the rotatable valve. The flapper is rotated at a speed of 1,000 rotations-per-minute (RPM's) or greater. The oscillating the pressure of the interior volume also includes exhausting the one or more process gases through a pressure control valve positioned downstream from the rotatable valve along the exhaust path. In one embodiment, which can be combined with other embodiments, the oscillating the pressure includes oscillating within a pressure range that is 1% to 10% of a mean pressure.

In one embodiment, which can be combined with other embodiments, the oscillating the amount of the one or more process gases in the interior volume includes opening a first supply valve coupled to a gas source along a supply path while a second supply valve is closed. The second supply valve is downstream from the first supply valve along the supply path. The oscillating the amount also includes, after the opening the first supply valve, closing the first supply valve and opening the second supply valve while the first supply valve is closed. The oscillating the amount of the one or more process gases can include repeating the operations of closing the second supply valve, opening the first supply valve while the second supply valve is closed, closing the first supply valve, and opening the second supply valve while the first supply valve is closed to oscillate the amount of the one or more process gases. In one embodiment, which can be combined with other embodiments, a charge volume is positioned between the first supply valve and the second supply valve along the supply path. The charge volume has an internal width that is larger than an internal width of the supply path.

In one embodiment, which can be combined with other embodiments, the oscillating the height of the substrate in the interior volume includes oscillating a substrate support upward and downward. The substrate is disposed on the substrate support such that the substrate is oscillated upward and downward. The oscillating the height of the substrate in the interior volume oscillates a processing region of the interior volume.

In one embodiment, which can be combined with other embodiments, the oscillating the boundary layer at operation 306 includes oscillating a distance between a ceiling of the interior volume and the surface of the substrate. The oscillating the distance between the ceiling of the interior volume and the surface of the substrate oscillates the processing region of the interior volume. In one embodiment, which can be combined with other embodiments, the oscillating the distance between the ceiling of the interior volume and the surface of the substrate includes oscillating upward and downward at least a portion of an upper component (such as a showerhead, a gas distribution plate, and/or a window) that at least partially defines the ceiling. In one embodiment, which can be combined with other embodiments, the oscillating the distance between the ceiling of the interior volume and the surface of the substrate includes oscillating upwardly and downwardly a diaphragm that at least partially defines the ceiling.

In one embodiment, which can be combined with other embodiments, the oscillating the boundary layer at operation 306 includes oscillating a distance between a gas injection assembly and the surface of the substrate. The gas injection assembly is used to introduce the flow of one or more process gases into the interior volume and move the flow of one or more process gases at operation at operation 304.

Benefits of the present disclosure include achieved effusion of reactants into and out of a 3D feature of substrates, enhanced chemical reactions of process gases with substrates, enhanced flow of reactants to surfaces of substrates, increased throughput, reduced downtime, and increased conformality including for substrates having high aspect ratios.

It is contemplated that one or more aspects disclosed herein may be combined. As an example, one or more aspects, features, components, and/or properties of the system 101 and the method 300 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of processing a substrate, comprising:
conducting a processing operation on the substrate in an interior volume of a processing chamber, the conducting the processing operation on the substrate comprising:
moving a flow of one or more process gases over a surface of the substrate, the flow of one or more process gases including a boundary layer adjacent the surface of the substrate; and
oscillating the boundary layer of the flow of one or more process gases while the flow of one or more process gases moves over the surface of the substrate and while the one or more process gases react with the substrate, the oscillating the boundary layer comprising one or more of:
oscillating a pressure of the interior volume,
oscillating an amount of the one or more process gases introduced into the interior volume,
oscillating a height of the substrate in the interior volume,
oscillating a distance between a ceiling of the interior volume and the surface of the substrate, or
oscillating a distance between a gas injection assembly and the surface of the substrate.

2. The method of claim 1, wherein one or more of the pressure, the amount of the one or more process gases introduced into the interior volume, the height, the distance between the ceiling of the interior volume and the surface of the substrate, or the distance between the gas injection assembly and the surface of the substrate is oscillated at an oscillation frequency that is within a range of 100 Hz to 1,000 Hz.

3. The method of claim 2, wherein one or more of the pressure, the amount of the one or more process gases introduced into the interior volume, the height, the distance between the ceiling of the interior volume and the surface of the substrate, or the distance between the gas injection assembly and the surface of the substrate is oscillated along a sinusoidal profile.

4. The method of claim 1, wherein the processing operation comprises one or more of an oxidation operation, a plasma immersion ion implantation operation, an epitaxial deposition operation, a chemical vapor deposition (CVD) operation, a physical vapor deposition (PVD) operation, an atomic layer deposition (ALD) operation, an etching operation, or a thermal annealing operation.

5. The method of claim 1, wherein the oscillating the pressure of the interior volume comprises exhausting the one or more process gases from the interior volume through a rotatable valve positioned along an exhaust path, and the rotatable valve comprises a flapper that is freely rotatable relative to a valve housing.

6. The method of claim 5, further comprising rotating the flapper using a pump motor coupled to the rotatable valve.

7. The method of claim 5, wherein the oscillating the pressure of the interior volume further comprises exhausting the one or more process gases through a pressure control valve positioned downstream from the rotatable valve along the exhaust path.

8. The method of claim 1, wherein the oscillating the height of the substrate in the interior volume comprises oscillating a substrate support upward and downward, wherein the substrate is disposed on the substrate support.

9. The method of claim 1, wherein the oscillating the amount of the one or more process gases introduced into the interior volume comprises:
opening a first supply valve coupled to a gas source along a supply path while a second supply valve is closed, wherein the second supply valve is downstream from the first supply valve along the supply path; and
after the opening the first supply valve, closing the first supply valve and opening the second supply valve while the first supply valve is closed.

10. The method of claim 9, wherein a charge volume is positioned between the first supply valve and the second supply valve along the supply path, and the charge volume has an internal width that is larger than an internal width of the supply path.

11. A non-transitory computer-readable medium comprising instructions that, when executed, cause a system to:
conduct a processing operation on a substrate in an interior volume of a processing chamber, the conducting the processing operation on the substrate comprising:
moving a flow of one or more process gases over a surface of the substrate, the flow of one or more process gases including a boundary layer adjacent the surface of the substrate; and
oscillate the boundary layer of the flow of one or more process gases while the flow of one or more process gases moves over the surface of the substrate and while the one or more process gases react with the substrate, the oscillating the boundary layer comprising one or more of:
oscillating a pressure of the interior volume,
oscillating an amount of the one or more process gases introduced into the interior volume,
oscillating a height of the substrate in the interior volume,
oscillating a distance between a ceiling of the interior volume and the surface of the substrate, or
oscillating a distance between a gas injection assembly and the surface of the substrate.

12. The non-transitory computer-readable medium of claim 11, wherein one or more of the pressure, the amount of the one or more process gases introduced into the interior volume, the height, the distance between the ceiling of the interior volume and the surface of the substrate, or the distance between the gas injection assembly and the surface of the substrate is oscillated at an oscillation frequency that is within a range of 100 Hz to 1,000 Hz.

13. The non-transitory computer-readable medium of claim 12, wherein one or more of the pressure, the amount of the one or more process gases introduced into the interior volume, the height, the distance between the ceiling of the interior volume and the surface of the substrate, or the distance between the gas injection assembly and the surface of the substrate is oscillated along a sinusoidal profile.

14. The non-transitory computer-readable medium of claim 11, wherein the processing operation comprises one or more of an oxidation operation, a plasma immersion ion implantation operation, an epitaxial deposition operation, a chemical vapor deposition (CVD) operation, a physical vapor deposition (PVD) operation, an atomic layer deposition (ALD) operation, an etching operation, or a thermal annealing operation.

15. A system for processing substrates, comprising:
a processing chamber having an interior volume;
a substrate support disposed in the interior volume;
a gas inlet fluidly coupled to an inlet path and a gas source to introduce one or more process gases into the interior volume;
a gas outlet fluidly coupled to an outlet path and a vacuum pump to exhaust the one or more process gases from the interior volume;
a rotatable valve disposed upstream of the vacuum pump along the outlet path, the rotatable valve comprising:
a valve housing, and
a flapper that is freely rotatable relative to the valve housing;
a pump motor coupled to the rotatable valve to rotate the flapper;
a pressure control valve disposed between the rotatable valve and the vacuum pump along the outlet path; and
a controller comprising instructions that, when executed, cause the system to:
conduct a processing operation on a substrate in the interior volume of the processing chamber, the conducting the processing operation on the substrate comprising:
moving a flow of the one or more process gases over a surface of the substrate, the flow of the one or more process gases including a boundary layer adjacent the surface of the substrate; and
oscillate the boundary layer of the flow of the one or more process gases while the flow of the one or more process gases moves over the surface of the substrate and while the one or more process gases react with the substrate, the oscillating the boundary layer comprising one or more of:
oscillating a pressure of the interior volume;
oscillating an amount of the one or more process gases introduced into the interior volume;
oscillating a height of the substrate in the interior volume;
oscillating a distance between a ceiling of the interior volume and the surface of the substrate; or
oscillating a distance between a gas injection assembly of the system and the surface of the substrate.

16. The system of claim 15, wherein the gas injection assembly further comprises a linear showerhead extending above the substrate support.

17. The system of claim 16, wherein the linear showerhead comprises a longitudinal duct having a central opening extending longitudinally and a plurality of openings formed in a bottom of the longitudinal duct.

18. The system of claim 17, wherein the gas inlet is formed in a sidewall of the processing chamber, and the linear showerhead is fluidly coupled to a supply path.

19. The system of claim 15, further comprising:
a magnetic stator; and
a rotor disposed in the interior volume and inwardly of the magnetic stator, wherein the substrate support is supported on the rotor and the substrate support is movable upwardly and downwardly.

20. The system of claim 19, wherein the instructions, when executed, cause one or more of:

the gas source to introduce the one or more process gases into the interior volume through the gas inlet;

the pump motor to rotate the flapper in a rotational direction while the one or more process gases are introduced into the interior volume, thereby oscillating a pressure of the interior volume;

altering an orifice of one or more valves, thereby oscillating an amount of the one or more process gases introduced into in the interior volume;

the magnetic stator to move the rotor upwardly and downwardly, thereby oscillating a height of the substrate support in the interior volume;

moving a ceiling of the interior volume upward and downward, thereby oscillating a distance between the ceiling of the interior volume and the surface of the substrate; or moving the gas injection assembly upward and downward, thereby oscillating a distance between the gas injection assembly and the surface of the substrate.

* * * * *